Feb. 24, 1970 P. M. KISINKO ET AL 3,497,773

PASSIVE CIRCUIT ELEMENTS

Filed Feb. 20, 1967

WITNESSES:

Leon M. Garman

Donald L. Winegar

INVENTORS

Paul M. Kisinko,

Frederick G. Ernick and William R. Harding

BY

C. L. Menzemer

ATTORNEY

United States Patent Office 3,497,773

Patented Feb. 24, 1970

3,497,773

PASSIVE CIRCUIT ELEMENTS

Paul M. Kisinko, Greensburg, Frederick G. Ernick, Youngwood, and William R. Harding, Jeannette, Pa., assignors to Westinghouse Electric Corporation, Pittsburgh, Pa., a corporation of Pennsylvania Filed Feb. 20, 1967, Ser. No. 617,298

Int. Cl. H02b *1/04*

U.S. Cl. 317—101 4 Claims

ABSTRACT OF THE DISCLOSURE

This invention provides an electronic element comprising a silicon carbide passive circuit element disposed on a major surface of a semiconductor diode. A layer of silicon carbide having a known level of impurity concentration is grown on the major surface of a diode. Unwanted portions of the silicon carbide are removed by repeated steps of oxidizing the unwanted material to silicon oxide and removing the silicon oxide so formed by chemical etching. Ohmic contacts are made to the silicon carbide passive circuit element by first forming a layer of silicon oxide on the element. A first electrical contact metal is then disposed on the silicon oxide layer followed by a second layer of an electrical contact metal on the first electrical contact metal. A subsequent heat treating process joins the electrical contact metal to the element by forming a layer of a solid solution of silicon, the metal of the first metal layer, and an oxide of the metal of the first metal layer disposed between the remainder of the silicon oxide layer and the remainder of the first metal layer.

BACKGROUND OF THE INVENTION

Field of the invention

This invention relates to an improvement in passive circuit elements and in particular to high resistance and high capacitance silicon carbide-silicon structures.

Description of the prior art

Presently, three principal techniques are employed in manufacturing integrated circuits. One of the three techniques is the monolithic approach in which all passive and active circuit elements are fabricated in one silicon wafer or chip. This approach has a disadvantage in that the physical limitations of silicon do not allow for high resistance resistors and high capacitance capacitors.

A second technique is to employ the thin film approach. However, difficulties with active circuit elements in the form of semiconducting properties limit the employment of thin films in integrated circuits.

A third technique is to employ a hybrid structure. In a hybrid structure one or more layers of semiconductor material is grown on a suitably prepared substrate. The hybrid structure is suitably processed to produce elements located in either the grown layer, the substrate, or both. However, integrated circuits having a hybrid structure fail to have passive circuit elements which have good thermal properties which allows one to incorporate high resistance resistors and/or high capacitance capacitors in the circuit.

SUMMARY OF THE INVENTION

In accordance with the present invention and in attainment of the foregoing objects, there is provided a semiconductor device comprising a body of semiconductor material having at least one region of first type semiconductivity, at least one region of second type semiconductivity, and a p-n junction formed between adjacent regions of different type semiconductivities, and at least one passive circuit element comprising silicon carbide mounted on a surface of one of the regions of semiconductivity of the body.

An object of this invention is to provide a high capacitance capacitor and a high resistance resistor for employment in hybrid integrated circuits, the capacitor and the resistor having good thermal properties.

Another object of this invention is to provide silicon carbide passive circuit elements for hybrid integrated circuits.

A further object of this invention is to provide a process for the fabrication of hybrid integrated circuits comprising silicon carbide passive circuit elements.

Other objects of this invention will, in part, be obvious, and will, in part, appear hereinafter.

DRAWINGS

Figure 3:
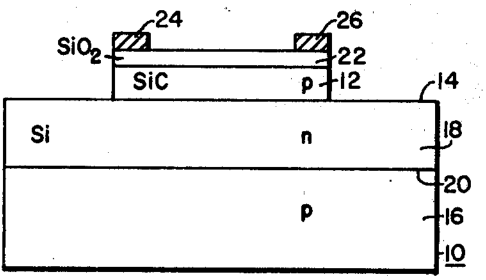
Figure 4:
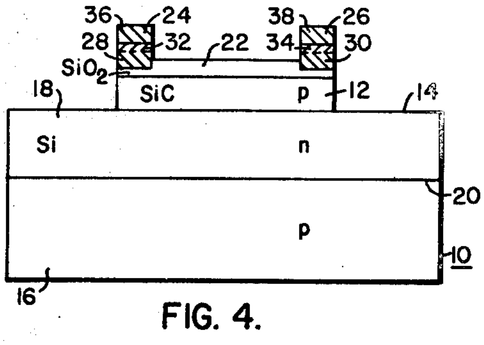
Figures 5, 6:
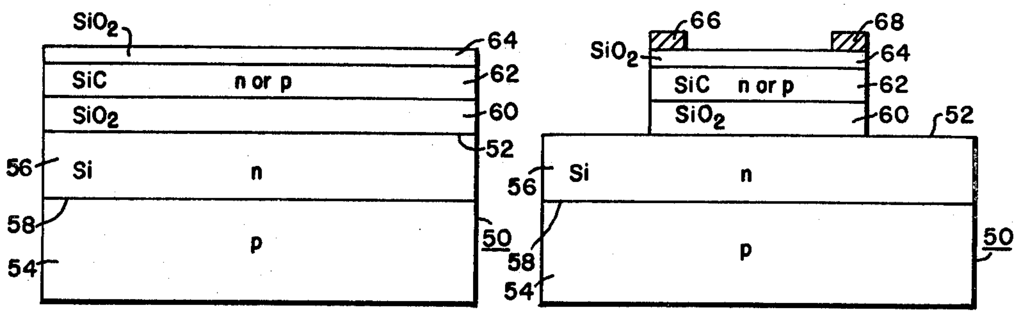

In order to more fully understand the nature and objects of this invention, reference should be had to the following drawings, in which:

FIGS. 1 through 4 are views in cross-section of a body of semiconductor material being processed in accordance with the teachings of this invention; and FIGS. 5 and 6 are views in cross-section of another body of semiconductor material being processed in accordance with the teachings of this invention.

DESCRIPTION OF THE INVENTION

Figure 1:
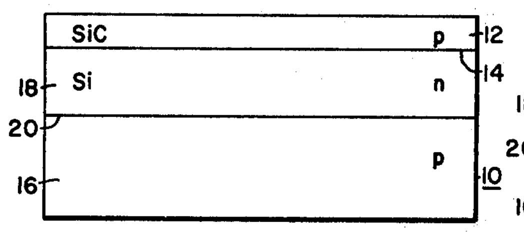

Referring now to FIG. 1 a body 10 of semiconductor material has a layer 12 of silicon carbide disposed on a surface 14 of the body 10. The body 10 comprises a semiconductor material selected from the group consisting of silicon, silicon carbide, germanium, compounds of Group III and Group V elements and compounds of Group II and Group VI elements. As most integrated circuits presently embody chips or bodies of silicon, and in order to more fully describe the invention, and for no other reason, the body 10 will be described as comprising silicon.

The body 10 has a first region 16 of p-type semiconductivity, a second region 18 of n-type semiconductivity and a p-n junction 20 between the two regions 16 and 18.

The layer 12 of silicon carbide is the material from which at least one passive circuit element is fabricated. The thickness of the layer 12 is determined by two factors. One of the factors is the value of the passive circuit element which is to be made. The value of a resistor for instance is determined by the level of impurity concentration in the material comprising the resistor, as well as the length, width and thickness of the resistor.

Since an electrical contact has to be made to the resistor a layer of silicon oxide should be present on top of the layer 12 to assure a good electrical contact. Exposing the layer 12 to the ambient does not usually form a sufficiently thick layer of silicon oxide which is desired as most of the silicon oxide layers formed would only be in the order of approximately 20 angstrom units. To assure good electrical and physical properties of the electrical contact to the passive circuit element a layer of silicon oxide approximately 100 to 500 angstrom units in thickness is required.

When the desired thickness of the layer 12 has been determined, silicon carbide is then grown on the surface 14 by any suitable means known to those skilled in the art such, for example, as by the thermal decomposition of a reactant gas mixture consisting of either methylsilanes or halogenated methylsilanes mixed with an inert gas selected from the group consisting of nitrogen, argon, helium, neon, xenon and hydrogen. As the layer 12 is being grown, a suitable dopant such, for example, as aluminum, is introduced into the reactant gas mixture to raise the layer 12 to the desired level of impurity concentration and to make it p-type semiconductivity. The layer 12 may be single crystal or polycrystalline in structure.

The layer 12 is then oxidized by suitable means, such for example, as by oxidation in an atmosphere of oxygen containing water vapor until a layer of silicon oxide not greater than approximately 300 angstrom units has been formed. The layer 22 is preferably only 300 A. in thickness in order to assure one that any silicon oxide layer remaining after alloying of the contacts will be of insufficient thickness to prevent the formation of low resistance ohmic electrical contacts.

Figure 2:
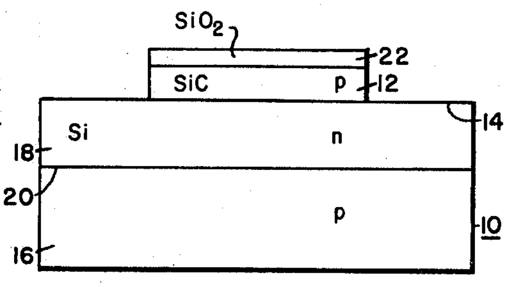

Employing photolithographic operations, the passive circuit elements are laid out on the surface of silicon oxide and suitably masked from the subsequent etching and oxidation process steps which follows. The undesired portions of the silicon oxide are removed with a suitable etchant such, for example, as hydrofluoric acid. The unwanted portions of the layer 12 of silicon carbide are then removed by one or more oxidation-etching process steps. Upon completion of this oxidation-etching process, or selective etching, of the layer 12, the protective mask is removed from the surface of the silicon oxide of each passive circuit element by trichloroethylene. The resulting structure of the body 10 with one passive circuit element is shown in FIG. 2 where the remaining portion of the layer 12 has a layer 22 of silicon oxide disposed thereon. Silicon oxide need only be present where electrical contacts are to be made to the layer 12.

With reference to FIG. 3 there is shown electrical contacts 24 and 26 affixed to each end of the layer 12 of silicon carbide. Employing known masking techniques and known metal deposition techniques, a layer, 3,000 angstrom units in thickness, of a metal selected from the group consisting of titanium, vanadium, tantalum, manganese, thorium, zirconium and niobium is first deposited on end portions of the layer 12. A second layer, 7,000 angstrom units in thickness, of a metal selected from the group consisting of platinum, silver, nickel, gold, rhodium, palladium and copper is then deposited on the first metal layer by known masking techniques and known metal deposition techniques, such, for example, as by metal evaporation, metallizing and sputtering. The structure is then heated to a temperature of from 200° C. to 600° C. for a period of from 5 to 30 minutes in air, in a vacuum, in an inert atmosphere, or in a hydrogen atmosphere. The heating process is necessary to allow the metal of the first layer of the contacts 24 and 26 to react with a portion of the oxygen in the layer 22 of silicon oxide.

Referring to FIG. 4, there is shown the final structure after the heating of the metals comprising the contacts 24 and 26. A portion of the metal comprising the first metal layer of the contacts 24 and 26 has been oxidized and has formed layers 28 and 30 of a solid solution consisting of the oxide of the metal comprising the first metal layer, metal of the first metal layer and silicon. The remaining portions 32 and 34 of the original first layer of metal is disposed between the layers 28 and 30 of solid solution and respective layers 36 and 38 of the second metal layer.

Electrical contact 24 therefore consists of the solid solution layer 28, the layer 32 of first metal, and the layer 36 of second metal. The electrical contact 26 consists of solid solution layer 30, the layer 34 of first metal and the layer 38 of second metal. The physical bond between the electrical contacts 24 and 26 and the passive circuit element comprising the layer 12 of silicon carbide is very strong and the electrical resistance of this good physical bond is low. Preferably layers 28 and 30 each consist of titanium oxide in titanium, layers 32 and 34 each consist of titanium and layers 36 and 38 each consist of silver.

In a similar manner passive circuit elements are fabricated on surfaces of bodies of semiconductor material wherein both the passive circuit element and the portion of the body on which it is fabricated both have the same type of semiconductivity. To electrically insulate the element from the body, a layer of silicon oxide is disposed between them. It is to be noted, of course, that the layer of silicon oxide is also employed to electrically insulate elements from regions of a body of semiconductor material wherein both the elements and the regions are of the same type semiconductivity.

With reference to FIG. 5, there is shown a body 50 of semiconductor material having a top surface 52, a first region 54 of first type semiconductivity, a second region 56 of second type semiconductivity and a p-n junction 58 in between the regions 54 and 56. The body 50 comprises any of the materials heretofore disclosed as comprising the body 10.

In order to more fully describe the invention, and for no other reason the body 10 will be described as comprising silicon and the regions 54 and 56 are respectively p-type and n-type. The passive circuit element to be fabricated on the top surface 52 may be either p-type semiconductivity or n-type semiconductivity.

A layer 60 of silicon oxide is disposed on the surface 52. Any suitable means known in the art may be employed to form the layer 60 of silicon oxide such, for example, as thermally growing a layer of silicon monoxide on the surface 52 and subsequently oxidizing it to silicon dioxide. The thickness of the layer 60 must be sufficient to effectively electrically insulate the passive circuit elements to be grown from the body 10.

In the same manner as described heretofore, a layer 62 of suitably doped silicon carbide is grown on the layer 60 of silicon oxide. The layer 62 as it is grown may be suitably doped with an impurity such, for instance, as arsenic, phosphorus, nitrogen, or boron to obtain the desired type of semiconductivity. Also, as previously described in relation to the body 10, a layer 64 of silicon oxide is formed on the layer 62 of silicon carbide.

Referring now to FIG. 6, there is shown the body 50 after having been further processed in the same manner as the body 10. Electrical contacts 66 and 68 have been affixed to opposite ends of the layer 62 forming the passive circuit element. Although the contacts 66 and 68 may be affixed by any suitable means, the manner of affixing them is preferably the same as previously described in processing the body 10. The resulting structure of the contacts 66 and 68 will be the same as the structures shown for electrical contacts 24 and 26.

Employing the processing steps heretofore described, passive circuit elements for integrated circuit applications can be manufactured on a body of semiconductor material wherein the elements will have high resistance or high capacitance values. These values are more reliable and can be controlled better than prior art devices. The silicon carbide material permits the element to tolerate higher temperatures than prior art devices without determination of the elements electrical or physical characteristics. Therefore, the silicon carbide passive circuit elements can dissipate more power with out deterioration. The values of the elements also remain more constant relative to temperature changes. The values of the resistors comprising silicon carbide material may be as high as 100,000 ohms as compared to approximately 20,000 ohms maximum obtainable with diffused silicon.

High capacitance value capacitors can be obtained by utilizing the silicon carbide-silicon heterojunction as illustrated in FIG. 3. Alternately, the layer 12 (FIG. 3) could be grown so as to contain a p-n silicon carbide-silicon junction and the resulting structure could be employed in high capacitance capacitors. Elements so fabricated can dissipate relatively large quantities of power and are less sensitive to temperature changes.

While the invention has been described with reference to particular embodiments and examples, it will be understood, of course, that modifications, substitutions and the like may be made therein without departing from its scope.

We claim as our invention:

1. An electronic element comprising:
a diode having two opposed major surfaces;
a silicon carbide passive circuit element disposed on one of the two opposed major surfaces; and
at least one ohmic contact affixed to said passive circuit element, said contact consisting of a thin layer of silicon oxide approximately 100 to 500 angstroms in thickness disposed on the element, a layer of a solid solution consisting of (1) an oxide of a first metal selected from the group consisting of titanium, vanadium, tantalum, manganese, thorium, zirconium and niobium, (2) the said first metal and (3) silicon, disposed on the layer of silicon oxide, a layer of the first metal disposed on the solid solution layer and a layer of a second metal selected from the group consisting of platinum, silver, nickel, gold, rhodium, palladium, and copper disposed on the layer of the first metal.

2. The electronic element of claim 1 in which the first metal is titanium and the second metal is silver.

3. The electronic element of claim 2 in which the silicon carbide passive circuit element has a first type of semiconductivity and the major surface of the diode on which said passive circuit element is disposed is a surface of a region of opposite type semiconductivity.

4. The electronic element of claim 1 in which a layer of oxide is disposed between the silicon carbide passive circuit element and the surface of the diode.

References Cited

UNITED STATES PATENTS

| | | |
|---|---|---|
| 3,290,127 | 12/1966 | Kahng et al. |
| 3,389,457 | 6/1968 | Goldman et al. |
| 3,400,309 | 9/1968 | Doo. |

ROBERT K. SCHAEFER, Primary Examiner

J. R. SCOTT, Assistant Examiner

U.S. Cl. X.R.

317—234